April 7, 1959 H. VAN DE WEG 2,881,267

CASCADED TRANSISTOR AND VACUUM TUBE AMPLIFIER

Filed Feb. 3, 1954

INVENTOR
HENDRIK VAN DE WEG

BY [signature]

AGENT

United States Patent Office 2,881,267

Patented Apr. 7, 1959

2,881,267

CASCADED TRANSISTOR AND VACUUM TUBE AMPLIFIER

Hendrik van de Weg, Eindhoven, Netherlands, assignor, by mesne assignments, to North American Philips Company, Inc., New York, N.Y., a corporation of Delaware Application February 3, 1954, Serial No. 407,974

Claims priority, application Netherlands February 3, 1953

4 Claims. (Cl. 179—171)

The present invention relates to a circuit arrangement for amplifying an electric signal. More particularly, the invention relates to a circuit arrangement for the amplification of an electric signal which comprises the cascade connection of a first and a second amplifier, one of said amplifiers comprising a transistor and the other an electron tube. The object of the invention is to provide a circuit arrangement the total amplification of which involves only a slight distortion. In accordance with the present invention, the transistor is of the type which produces an output signal which is approximately a 2/3 power of the input signal, and the signal distortion thus produced is compensated for by adjusting the tube approximately in the 3/2 power region of its amplification characteristic curve.

Figure 1:
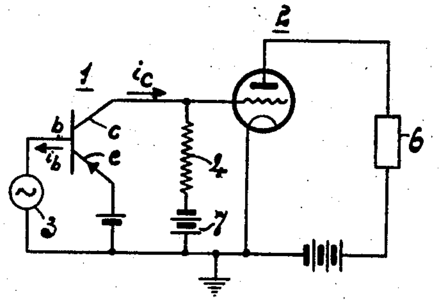
Figure 2:
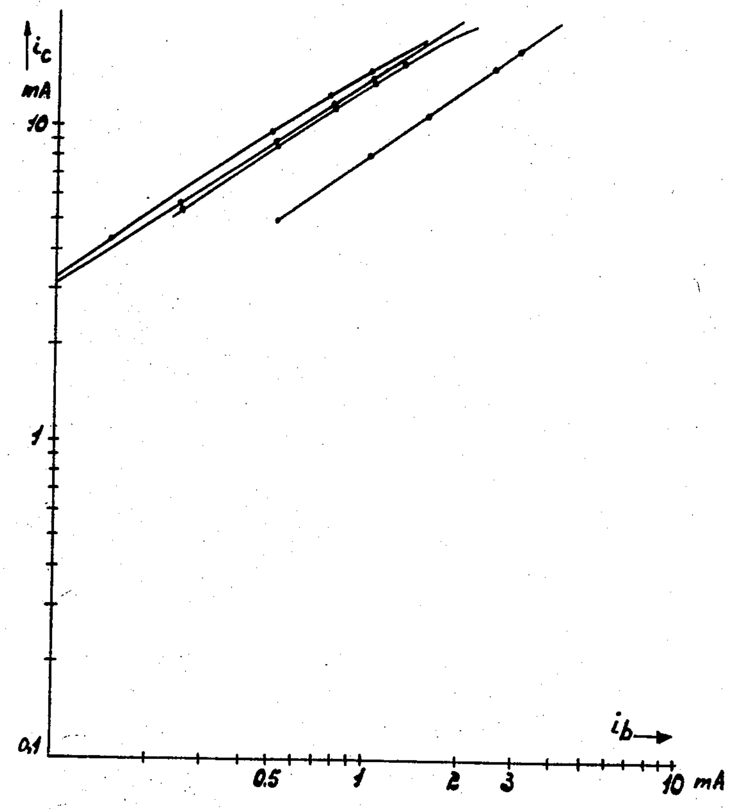

The invention will now be explained with reference to the accompanying drawing, in which:

Fig. 1 is a schematic diagram of an embodiment of a circuit arrangement according to the invention, given by way of example; and Fig. 2 is a graphical presentation of a number of transistor characteristic curves.

The circuit arrangement shown in Fig. 1 comprises a cascade connection of a transistor amplifier 1 and a tube amplifier 2. A source of signals 3 is included in the circuit of a base electrode *b* of the transistor 1, the emitter electrode *e* of which is grounded with respect to signal frequencies with the result that across an impedance 4 included in the circuit of a collector electrode *c* an amplified signal is produced and subsequently supplied to the control grid of the tube 2 in the anode circuit of which an output impedance 6 is included.

The invention is based on the discovery that in certain types of transistors the relation $$i_c=a.i_b^{2/3} \qquad (1)$$

where $a$=a constant, $i_c$=the collector current and $i_b$=the base current of the transistor, is satisfied with a comparatively high degree of accuracy. Fig. 2 shows for a number of these transistors the values of $i_c$ plotted versus those of $i_b$ to a doubly logarithmic scale. The graphs change only slightly with variation of the collector voltage. The slope of the graphs is substantially equal to 2/3 in accordance with the index in relation (1).

Transistors which satisfy this property can be obtained in a known manner by starting with a crystal element of one type of conductivity, for example, a germanium crystal of the n-conductivity type a suitably chosen material, for example indium, is arranged adjacent the germanium crystal, and the indium, after heating for a predetermined time at a suitable temperature, for example 500° C., by diffusion and/or segregation produces zones of the opposite conductivity type in the crystal which approach one another so as to be spaced away by a small distance, preferably smaller than the characteristic diffusion length of the minority carriers in the intermediate crystal material. The behaviour according to relation (1) would appear to be due to the fact that the intermediate crystal material is not equal in thickness throughout.

As is well known, an electron tube comprising an evenly wound control grid exhibits in the starting current range an anode current $i_a$ as a function of the control grid voltage $V_g$ reckoned from the cut-off voltage of the tube which with a comparatively high degree of accuracy satisfies the relation $$i_a=b\ V_g^{3/2} \qquad (2)$$

where $b$ represents a constant.

A control grid bias voltage battery 7 (which also acts as a collector supply battery) has a value which is approximately equal to the said cut-off voltage. Thus, the distortion introduced by the relation (1) is compensated for by the tube 2 being adjusted in that part of its characteristic curve which is determined by the relation (2).

Obviously the transistor 1 may be arranged to succeed the tube amplifier 2, in which case, however, usually less power can be supplied to the output impedance 6. Alternatively, for further reduction of the distortion, negative feed-back may be provided.

What is claimed is:

1. A circuit arrangement for amplifying an electrical signal comprising first and second amplifiers arranged in cascade connection, one of said amplifiers comprising a transistor producing a collector output signal having a magnitude approximately a 2/3 power of an input signal thereto, said transistor having at least one collector electrode, said second amplifier comprising an electron tube producing an output signal approximating a 3/2 power of an input signal thereto, said electron tube having a control grid, and a single source of supply voltage connected across the output of said transistor and across the input of said electron tube, said supply voltage having a value sufficient to bias said grid to cut-off and sufficient to provide a supply voltage for said collector electrode, said circuit arrangement exhibiting a substantially linear amplifying relationship between the input and output circuits thereof.

2. A circuit arrangement for amplifying an electrical signal comprising first and second amplifiers arranged in cascade connection, one of said amplifiers comprising a transistor having emitter, collector and base electrodes, means for applying an input signal to a base electrode of said transistor, said transistor producing a collector signal having a magnitude approximating a 2/3 power of said input signal, said second amplifier comprising an electron tube having a cathode, an anode and a control grid, said tube producing an anode signal approximating a 3/2 power of a signal applied to said control grid, and means for coupling said first and second amplifiers comprising means for connecting a collector electrode of said transistor to said control grid, means for connecting an emitter electrode of said transistor to said cathode, and a single source of supply voltage connected between said first and last-mentioned connecting means, said supply voltage having a value sufficient to bias said grid to cut-off and sufficient to provide a supply voltage for said collector electrode, said circuit arrangement exhibiting a substantially linear amplifying relationship between the said base electrode and the said anode.

3. A circuit arrangement as claimed in claim 1, wherein said transistor is a diffusion type transistor and is connected as a grounded emitter amplifier.

4. A circuit arrangement as claimed in claim 1, wherein said transistor is a segregation type transistor and is connected as a grounded emitter amplifier.

References Cited in the file of this patent

UNITED STATES PATENTS

| | | |
|---|---|---|
| 1,590,263 | Stone | June 29, 1926 |
| 2,600,500 | Haynes et al. | June 17, 1952 |

FOREIGN PATENTS

| | | |
|---|---|---|
| 673,604 | Great Britain | June 11, 1952 |